United States Patent [19]

Warburton

[11] 3,715,632

[45] Feb. 6, 1973

[54] LIQUID COOLED SEMICONDUCTOR DEVICE CLAMPING ASSEMBLY

[75] Inventor: William Warburton, Skaneateles, N.Y.

[73] Assignee: General Electric Company

[22] Filed: Jan. 8, 1971

[21] Appl. No.: 105,014

Related U.S. Application Data

[62] Division of Ser. No. 818,578, April 23, 1969, abandoned.

[52] U.S. Cl..........317/234 R, 317/234 A, 317/234 B, 317/234 G, 317/234 P

[51] Int. Cl...................................................H01l 1/12

[58] Field of Search...317/234 A, 234 B, 234 P, 100; 269/219, 220, 267, 287

[56] References Cited

UNITED STATES PATENTS

| | | | |
|---|---|---|---|
| 3,471,757 | 10/1969 | Sias | 317/234 P |
| 3,619,473 | 11/1971 | Meyerhoff et al. | 317/234 A |
| 3,413,532 | 11/1968 | Boyer | 317/235 |
| 3,467,897 | 9/1969 | Hoffmann et al | 317/234 |
| 3,226,466 | 12/1965 | Martin | 174/15 |
| 3,238,425 | 3/1966 | Geyer | 317/234 P |
| 3,447,118 | 5/1969 | Ferree | 338/21 |
| 3,328,650 | 6/1967 | Boyer | 317/234 A |

FOREIGN PATENTS OR APPLICATIONS

| | | | |
|---|---|---|---|
| 992,442 | 5/1965 | Great Britain | 317/234 A |

OTHER PUBLICATIONS

Gutzwiller; "Thyristors and Rectifier Diodes", IEEE Spectrum, Aug. 1967, page 109 replied upon

*Primary Examiner*—John W. Huckert
*Assistant Examiner*—William D. Larkins
*Attorney*—Robert J. Mooney, Nathan J. Cornfeld, Carl O. Thomas, Frank L. Neuhauser, Oscar B. Waddell and Joseph B. Forman

[57] ABSTRACT

A semiconductor device adapted to be mounted with compression applied to the major current carrying terminals is assembled with coolant units mounted adjacent opposite ends. The coolant units include a central core of highly electrically and thermally conductive material cooperating with a shell to define a coolant passage therethrough. The coolant units and semiconductor device are compressively associated by bolts cooperating with a fulcrum mounted deflectable plate. An insulative casing positions the bolts, the fulcrum, and a mounting bracket and prevents short circuiting of the semiconductor device terminals. A deflection gauge insures optimum compression of the semi-conductor device.

3 Claims, 3 Drawing Figures

PATENTED FEB 6 1973

3,715,632

Figures 1, 2, 3:
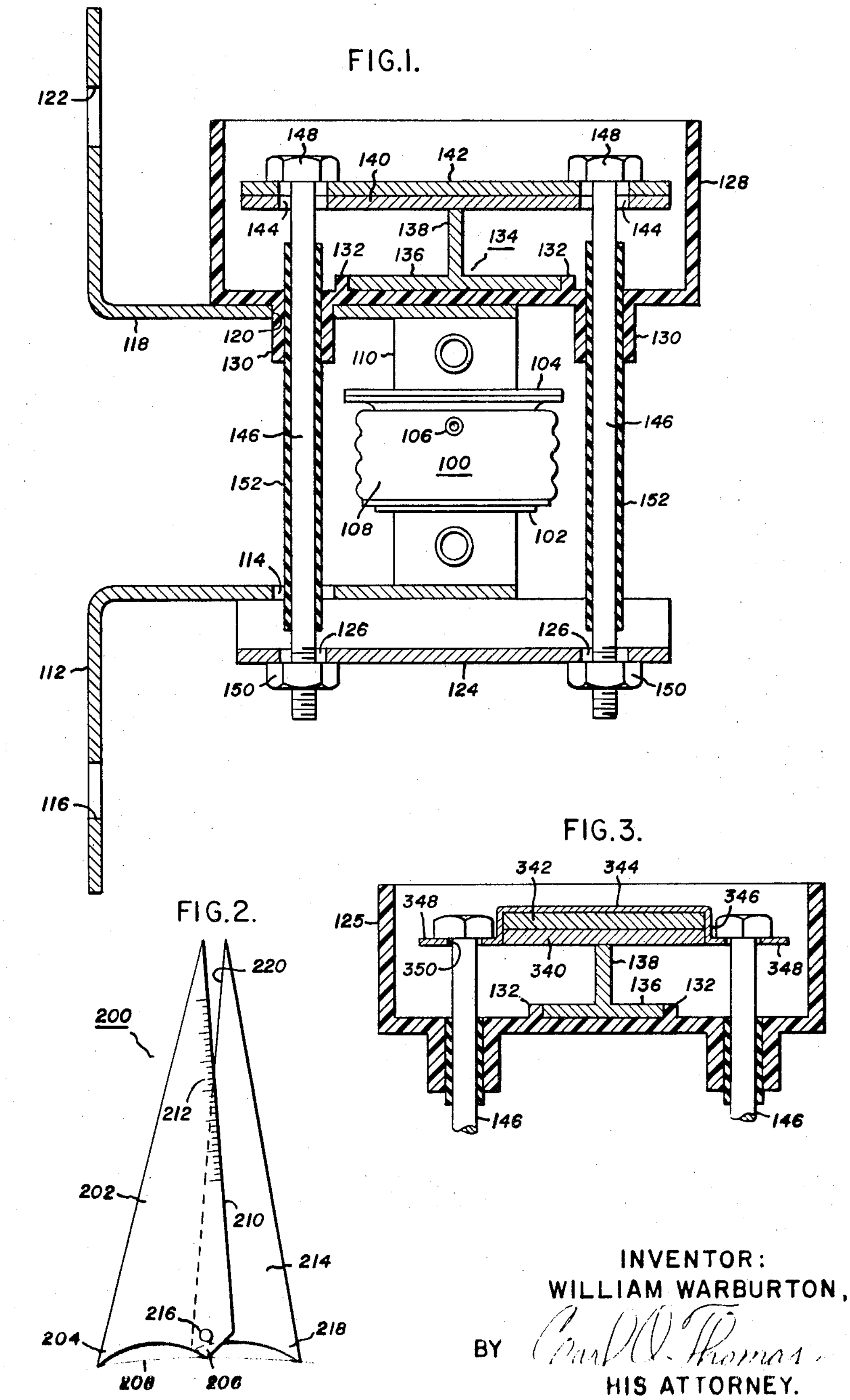

INVENTOR:
WILLIAM WARBURTON,

BY [signature]
HIS ATTORNEY.

LIQUID COOLED SEMICONDUCTOR DEVICE CLAMPING ASSEMBLY

This application is a division of my copending application Ser. No. 818,578, filed Apr. 23, 1969 now abandoned, titled Liquid Cooled Semiconductor Device Assembly.

My invention is directed to novel structural arrangements for utilizing semiconductor devices adapted to be compressively engaged at their opposed major current carrying terminals.

As is well understood in the art semiconductor devices are commonly manufactured and sold in a form in which a substantial compressive force must be applied to opposed major current carrying terminals in order to achieve a desirable low impedance electrically and thermally conductive relationship between the terminal elements and the internal contact layers and semiconductor crystal element. Typically such a semiconductor device is referred to as a press pack.

A wide variety of clamping fixtures are sold with and separate from the press packs for the purpose of providing a low impedance electrical connection and withdrawing the large quantities of heat which may be generated during high current applications. One disadvantage associated with conventional fixtures is that they generally incorporate a bulky array of heat transfer fins to dissipate heat generated with the semiconductor device to the ambient air. This multiplies the overall size of the semiconductor device and fixture to many times the size of the semiconductor device alone. Another commonly encountered disadvantage is that it is frequently difficult to determine exactly when the right degree of compression has been applied to the semiconductor device to obtain optimum performance. With too little compression the impedance to electrical and thermal conduction is frequently high. With too much compression the semiconductor crystal within the device may be damaged.

It is an object of my invention to provide an arrangement whereby a press pack type of semiconductor device may be readily cooled with a minimum addition to the bulk of the overall assembly per unit of heat removed.

It is another object of my invention to provide an arrangement whereby the optimum degree of compression applied to a press pack type of semiconductor device may be readily determined.

In one aspect my invention is directed to an apparatus for providing electrical connection to and cooling of a semiconductor device adapted to be compressively engaged at its opposed major current carrying terminals. The apparatus is comprised of electrically and thermally conductive means. Mounting means are provided for compressively urging the conductive means into low impedance thermally and electrically conductive relation with one of the opposed major current carrying terminals of the semiconductor device. The mounting means includes means providing a fulcrum positioned to be compressively urged toward one of the conductive means. In this form a deflectable plate overlies the fulcrum, and a rigid base is positioned to be compressively urged toward an opposed terminal of the semiconductor device. Means are provided for urging the deflectable plate and rigid base toward the opposed terminals of the semiconductor device. An electrically insulative casing element is interposed between the electrically and thermally conductive means and the fulcrum. Means may be associated with the deflectable plate to indicate a desired degree of compression applied to the semiconductor device.

My invention may be better understood by reference to the following detailed description considered in conjunction with the drawings, in which FIG. 1 is a vertical section with the coolant units and semiconductor device shown in elevation, FIG. 2 is an elevation of a deflection gauge, and FIG. 3 is a sectional detail of a plate and strap assembly.

Noting FIG. 1, a semiconductor device of the press pack type 100 is provided with first and second major current carrying terminals 102 and 104 and a control terminal 106 sealingly associated with an insulative housing 108. Identical coolant units 110 are aligned with the major current carrying terminals and lie in direct engagement therewith. The cooling units are more specifically disclosed and claimed in my above-referenced copending application, the disclosure of which is here incorporated by reference. An electrically conductive mounting bracket 112 is associated with the lower coolant unit and is provided with a clearance aperture 114 and a mounting aperture 116. A similar electrically conductive bracket 118 is associated with the upper coolant unit and is provided with a clearance aperture 120 and a mounting aperture 122.

To compressively associate the mounting brackets, coolant units, and the semiconductor device a U-shaped channeled rigid frame 124 is associated with the lower bracket. The rigid frame is provided with apertures 126. A molded insulative casing 128 is associated with the upper bracket. The casing is provided with two annular liners 130 projecting from one major surface, one of which extends through the clearance aperture 120. Stops 132 formed integrally with another major surface of the casing locate fulcrum element 134 having a base portion 136 and an upstanding bar portion 138. Deflectable plates 140 and 142 rest on the bar portion of the fulcrum. Aligned apertures 144 are provided in the plates. Tie-bolts 146 extend through the apertures 126 and 144 and through the annular liners. The tie bolts are provided with head portions 148 that engage the plate 142 and have threadedly received thereon nuts 150 that engage the rigid frame. An insulative sleeve 152 covers a major mediate portion of the tie bolts.

In FIG. 2 a deflection gauge 200 is provided. As shown a first blade 202 is provided with projections 204 and 206 lying along an arc 208. The first blade is provided with an edge 210 extending generally away from the projection 206 and provided with calibrating indicia at 212. A second blade 214 is pivotally associated with the first blade in partially overlapping relation with a hinge pin 216. The second blade is provided with a projection 218 lying along the arc and spaced from the hinge pin. An edge 220 of the second blade is shown intersecting the edge 210.

To place the invention in use the apparatus may be assembled similarly as in FIG. 1. Instead of employing two coolant units 110 as shown, a single coolant unit may be employed if desired. Many other variations in assembly are possible. For example, the relationship of the coolant units and semiconductor device in FIG. 1 could be reversed. Two semiconductor devices could be mounted in series with a coolant unit interposed therebetween. Generally it is preferred to have one coolant unit immediately adjacent each terminal of a semiconductor device. Accordingly, with a plurality of semiconductor devices to be electrically mounted in series a stack comprised of coolant units and semiconductor devices would be mounted with the coolant units forming the end-most elements of the stack and being alternated in the stack with semiconductor devices. Where the semiconductor device 108 is to be subjected to only light electrical current loads, the coolant units may be omitted entirely and the mounting brackets 112 and 118 may be relied upon to perform the function of cooling the semiconductor device. The length of the tie-bolts 146 is chosen to accommodate the size of stack to be mounted.

As the tie-bolts are tightened to clamp the coolant units and semiconductor device or devices in position for low impedance thermal and electrical engagement with each other and the conductive brackets 112 and 118, the plates 140 and 142 tend to bow convexly upwardly under the bending influence of the tie-bolts exerting a bending moment by coacting with the bar portion 138 of the fulcrum 134. The amount of compression that is applied to the semiconductor device stack to produce a given increment of deflection of the upper plate surface is, of course, variable, depending on the number of plates employed and their stiffness. The rigid frame 124 is constructed in channeled form so that its deflection under the influence of the tie-bolts is minimal.

In the condition shown in FIG. 1 the tie-bolts have not been tightened sufficiently to deflect the plates. As the tie-bolts are further tightened, however, the upper surface of the plate will begin to bow convexly upwardly. The amount of compression applied to the semiconductor device may be readily determined by utilizing the deflection gauge 200. In using this gauge the tips of projections 204, 206, and 218 are placed along arc 208, which may be the upper convex surface of the plate 142 when the bolts are at least partially tightened. Depending on the degree of curvature of the surface, the second blade 214 will rotate clockwise with respect to the first blade 202 about pivot 216 so that the edge 220 of the second blade intersects the edge 210 of the first blade at a point which is indicative of the degree of compression being applied to the semiconductor device. The scale 212 may be chosen to allow either the degree of curvature or the degree of compression to be read directly.

When the device is assembled an electrical current may be passed through the assembly through electrical circuit connections to mounting brackets 112 and 118. The electrical current is transmitted from one mounting bracket through a coolant unit, from the coolant unit to a terminal of the semiconductor device, through the semiconductor device, from the remaining terminal of the semiconductor device to the remaining coolant unit, and from the remaining coolant unit to the remaining bracket. With the semiconductor device in its conductive state, as, for example, when a proper signal is supplied to the control electrode 106, or, in the case of diode rectifier, a potential difference of proper polarity is applied across the terminals, a large current may be passed through the semiconductor device. If no provision is made for actively cooling the semiconductor device, it may be damaged.

The coolant units allow electrical current to pass therethrough with minimum resistance heating while at the same time the coolant units act as heat sinks withdrawing heat from the terminals of the semiconductor device which terminals are in turn acting as heat sinks for the semiconductor crystal within the device. Heat is rejected from the coolant units to a fluid medium which is constantly being circulated therethrough so that a temperature differential is always maintained between the coolant units and circulating fluid. It is anticipated that any conventional fluid coolant including water, air, mercury, and commercially available organic fluid coolants may be employed.

In the assembly construction the casing 128 is noted to combine several separate functions. First, the casing serves to electrically insulate the bolts from the mounting bracket 118. Second, the casing positions the bolts. Third, the casing positions the fulcrum and insulates it from mounting bracket 118. Fourth, the casing positions the mounting bracket 118. At the same time it is to be noted that casing is constructed and arranged so that it requires no appreciable tensile strength. It is also to be noted that the casing annular liners 130 eliminate any necessity of providing insulative sleeves 152 on the bolts, although the use of insulative sleeves is preferred as an extra precaution against inadvertent short circuiting of the semiconductor device through the bolts. The mounting bracket may cooperate with one or both liners. Where the bracket cooperates with only one liner, it is unnecessary to provide more than one liner.

In FIG. 3 a variant form of my invention is shown in which the deflectable plates 140 and 142 are replaced by somewhat shorter plates 340 and 342 which lack apertures. A thin metal strap 344 overlies the plates and holds them in position by shoulder portions 346 provided at both ends of the plates. The strap is provided with integrally formed ears 348 each having an aperture 350 located therein through which the tie-bolts 146 pass. In addition to positioning the deflectable plates the tie-bolts prevent the heads of the tie-bolts from rotating when the nuts are tightened thereon. By using a strap in addition to the deflectable plates it is unnecessary to provide apertures in the deflectable plates. Since the deflectable plates are formed of relatively expensive and high strength metal as compared to the strap, providing apertures in the strap rather than the plates allows a significant saving in fabrication cost.

What I claim and desire to secure by Letters Patent of the United States is:

1. An apparatus for providing electrical connection to and cooling of a semiconductor device adapted to be compressively engaged at its opposed major current carrying terminals comprising:

a. electrically and thermally conductive means associated with the major current carrying terminals of the semiconductor device and including first and second electrical circuit connector means, said first electrical circuit connector means having an aperture therein;

b. means for compressively urging said conductive means into low impedance thermally and electrically conductive relation with the opposed major current carrying terminals of the semiconductor device including tie-bolt means and a fulcrum and a deflectable plate for coupling said tie-bolt means to said fulcrum;

c. an electrically insulative casing interposed between said electrically and thermally conductive means and said fulcrum, said electrically insulative casing including:

i. an annular formed integrally with said casing for receiving and locating said tie-bolt means and for insulating said tie-bolt means from the first electrical circuit connector means, said extending through said aperture in said first electrical connector means to locate said first electrical circuit connector means, and ii. shoulder means integral with said casing to locate said fulcrum and prevent relative movement of said deflectable plate.

2. An apparatus according to claim 1 wherein both of said electrical circuit connector means are mounting brackets for said apparatus and wherein said mounting brackets are provided with aligned tie-bolt receiving apertures.

3. An apparatus for providing electrical connection to and cooling of a semiconductor device adapted to be compressively engaged at its opposed major current carrying terminals comprising:

a. electrically and thermally conductive means associated with the major current carrying terminals of the semiconductor device and including first and second electrical circuit connector means;

b. means for compressively urging said conductive means into low impedance thermally and electrically conductive relation with the opposed major current carrying terminals including:

i. a fulcrum positioned to be compressively urged toward one of the semiconductor terminals;

ii. a deflectable plate means overlying said fulcrum, said deflectable plate means including at least one deflectable plate overlying said fulcrum and a thin metal strap overlying said deflectable plate having opposite ends extending beyond said deflectable plate, said ends having apertures therein and having shoulders engageable with the ends of said deflectable plate to prevent longitudinal movement thereof relative to said fulcrum; and iii. tie bolts extending through said apertures in said strap; and c. an electrically insulative casing interposed between said electrically and thermally conductive means and said fulcrum and having interior shoulders forming stops to prevent relative movement of said fulcrum longitudinally of said deflectable plate.

* * * * *